US009035415B2

(12) United States Patent
Senoo

(10) Patent No.: US 9,035,415 B2
(45) Date of Patent: May 19, 2015

(54) VERTICAL SEMICONDUCTOR DEVICE COMPRISING A RESURF STRUCTURE

(75) Inventor: Masaru Senoo, Okazaki (JP)

(73) Assignee: TOYOTA JIDOSHA KABUSHIKI KAISHA, Toyota-Shi (JP)

( * ) Notice: Subject to any disclaimer, the term of this patent is extended or adjusted under 35 U.S.C. 154(b) by 0 days.

(21) Appl. No.: 13/640,447

(22) PCT Filed: Mar. 28, 2011

(86) PCT No.: PCT/JP2011/057670
§ 371 (c)(1),
(2), (4) Date: Oct. 10, 2012

(87) PCT Pub. No.: WO2012/131878
PCT Pub. Date: Oct. 4, 2012

(65) Prior Publication Data
US 2013/0037805 A1    Feb. 14, 2013

(51) Int. Cl.
*H01L 29/66* (2006.01)
*H01L 29/06* (2006.01)
(Continued)

(52) U.S. Cl.
CPC ........ *H01L 29/0615* (2013.01); *H01L 29/7811* (2013.01); *H01L 29/7395* (2013.01);
(Continued)

(58) Field of Classification Search
USPC ............................. 257/49, 168–170, 487–496
See application file for complete search history.

(56) References Cited

U.S. PATENT DOCUMENTS 5,159,427 A * 10/1992 Ogura et al. .................. 257/500
5,932,894 A    8/1999 Bakowski
(Continued)

FOREIGN PATENT DOCUMENTS

CN    101258608 A    9/2008
JP    7-193018 A    7/1995
(Continued)

OTHER PUBLICATIONS

B. W. Liou, et al.: "High Power Silicon Schottky Barrier Diodes with Different Edge Termination Structures", Japanese Journal of Applied Physics, 2005, vol. 44, No. 40, pp. L1244-L1247.
(Continued)

*Primary Examiner* — Thao X Le
*Assistant Examiner* — Gardner W Swan
(74) *Attorney, Agent, or Firm* — Kenyon & Kenyon LLP

(57) ABSTRACT

A technology for a vertical semiconductor device having a RESURF structure, which is capable of preventing the drop of the withstand voltage when the adhesion of external electric charges occurs is provided. The vertical semiconductor device disclosed in the present specification has a cell region and a non-cell region disposed outside the cell region. This vertical semiconductor device has a diffusion layer disposed in at least part of the non-cell region. When the vertical semiconductor device is viewed in a plane, the diffusion layer has an impurity surface density higher than that satisfying a RESURF condition at an end part close to the cell region, and an impurity surface density lower than that satisfying the RESURF condition at an end part far from the cell region. When the vertical semiconductor device is viewed in a plane, a region in the diffusion layer that has the impurity surface density higher than that satisfying the RESURF condition has a greater mean gradient of the impurity surface density than a region in the diffusion layer that has the impurity surface density lower than that satisfying the RESURF condition.

3 Claims, 8 Drawing Sheets

(51) Int. Cl.
*H01L 29/78* (2006.01)
*H01L 29/739* (2006.01)
*H01L 29/861* (2006.01)
*H01L 29/04* (2006.01)
*H01L 29/10* (2006.01)
*H01L 29/08* (2006.01)

(52) U.S. Cl.
CPC .......... *H01L29/8611* (2013.01); *H01L 29/063* (2013.01); *H01L 29/0847* (2013.01); *H01L 29/0878* (2013.01); *H01L 29/0638* (2013.01); *H01L 29/04* (2013.01); *H01L 29/1095* (2013.01)

(56) References Cited

U.S. PATENT DOCUMENTS

| | | | |
|---|---|---|---|
| 6,124,626 A * | 9/2000 | Sandhu et al. | 257/532 |
| 6,215,168 B1 | 4/2001 | Brush | |
| 6,765,239 B2 * | 7/2004 | Hiyoshi et al. | 257/107 |
| 7,026,650 B2 * | 4/2006 | Ryu et al. | 257/77 |
| 2002/0030225 A1 | 3/2002 | Nakamura | |
| 2007/0222023 A1 | 9/2007 | Schmidt | |
| 2009/0261348 A1 | 10/2009 | Tarui | |
| 2013/0069694 A1 | 3/2013 | Saito et al. | |

FOREIGN PATENT DOCUMENTS

| | | |
|---|---|---|
| JP | 7-273325 A | 10/1995 |
| JP | 2001-015741 A | 1/2001 |
| JP | 2001-077347 A | 3/2001 |
| JP | 2002-507325 A | 3/2002 |
| JP | 2004-214268 A | 7/2004 |
| JP | 2005-093809 A | 4/2005 |
| JP | 2005-311006 A | 11/2005 |
| JP | 2007-042836 A | 2/2007 |
| JP | 2007-266123 A | 10/2007 |
| JP | 2008-103529 A | 5/2008 |
| JP | 2008-147362 A | 6/2008 |
| JP | 2008-227240 A | 8/2008 |
| JP | 2008-227237 A | 9/2008 |
| JP | 2008-227238 A | 9/2008 |
| JP | 2008-227239 A | 9/2008 |
| JP | 2009-164486 A | 7/2009 |
| WO | 99/00849 A2 | 1/1999 |
| WO | 2007/029375 A1 | 3/2007 |

OTHER PUBLICATIONS

International Search Report mailed Jun. 28, 2011 & Written Opinion (w. translation) of PCT/JP2011/057670.

R. Stengl et al., "Variation of Lateral Doping—a New Concept to Avoid High Voltage Breakdown of Planar Junctions," International Electron Devices Meeting, Technical Digest, Dec. 1-4, 1985, pp. 154-157.

T. Stockmeier et al., "Sipos-Passivation for High Voltage Power Devices with Planar Junction Termination," Proceedings of the 3rd International Symposium on Power Semiconductor Devices and ICS, Apr. 22-24, 1991, pp. 145-148.

J.A. Appels et al., "High Voltage Thin Layer Devices (Resurf Devices)," IEEE, Philips Research Laboratories, Eindhoven—The Netherlands, 1979, pp. 238-244.

International Preliminary Report on Patentability (with English-language translation), mailed on Jul. 29, 2011, in International Application No. PCT/JP2011/057670.

* cited by examiner

VERTICAL SEMICONDUCTOR DEVICE COMPRISING A RESURF STRUCTURE

This is a 371 national phase application of PCT/JP2011/057670 filed 28 Mar. 2011, the contents of which are incorporated herein by reference.

TECHNICAL FIELD

The present invention relates to a vertical semiconductor device.

BACKGROUND ART

FLR (Field Limiting Ring) structures, RESURF (REduced SURface Field) structures and the like have been proposed as peripheral voltage-withstanding structures of semiconductor devices. In general, the RESURF structures can realize higher withstand voltages in small occupied areas, compared to the FLR structures. The RESURF structures of semiconductor devices are disclosed in patent documents 1 to 4.

CITATION LIST

Patent Literature

Patent Document 1: U.S. Patent Application Publication No. 2007/0222023
Patent Document 2: Japanese Patent Application Publication No. H7-193018
Patent Document 3: Japanese Patent Application Publication No. H7-273325
Patent Document 4: Japanese Patent Application Publication No. 2001-15741.

SUMMARY OF INVENTION

Technical Problem

A vertical semiconductor device which has a cell region and a non-cell region outside the cell region realizes a RESURF structure by disposing a diffusion layer in at least part of the non-cell region. When a voltage is applied to the non-cell region of this vertical semiconductor device, the voltage is shared by a depletion layer spreading from the interface of the diffusion layer, so that the electric field does not concentrate therein. Accordingly, a high withstand voltage can be realized.

In some cases, external electric charges such as movable ions adhere to the surface of the non-cell region of this type of vertical semiconductor device. The adhesion of external electric charges disturbs the carrier distribution of the non-cell region, having an impact on the formation of the depletion layer. This results in a drop of the withstand voltage of the vertical semiconductor device. A technology for a vertical semiconductor device capable of preventing the drop of the withstand voltage even when the adhesion of external electric charges occurs is desired.

The present specification provides a technology capable of solving the problem described above. The present specification provides a technology for a vertical semiconductor device having a RESURF structure, which is capable of preventing the drop of the withstand voltage when the adhesion of external electric charges occurs.

Solution to Technical Problem

A vertical semiconductor device disclosed in the present specification has a cell region and a non-cell region disposed outside the cell region. This vertical semiconductor device has a diffusion layer disposed in at least part of the non-cell region. When the vertical semiconductor device is viewed in a plane, the diffusion layer has an impurity surface density higher than that satisfying a RESURF condition at an end part close to the cell region, and an impurity surface density lower than that satisfying the RESURF condition at an end part far from the cell region. When the vertical semiconductor device is viewed in a plane, a region in the diffusion layer that has the impurity surface density higher than that satisfying the RESURF condition has a greater mean gradient of the impurity surface density than a region in the diffusion layer that has the impurity surface density lower than that satisfying the RESURF condition. The impurity surface density described herein is a value obtained by integrating the impurity concentration of the diffusion layer along a depth direction of the diffusion layer, and is equivalent to an amount of impurity injected per unit area when the vertical semiconductor device is viewed in a plane. When silicon is used as a semiconductor material, the impurity surface density satisfying the RESURF condition is approximately $1 \times 10^{12}$ [cm$^{-2}$]. It is preferred that the maximum impurity surface density of the diffusion layer be equal to or lower than $5 \times 10^{13}$ [cm$^{-2}$].

When a voltage is applied to the non-cell region of the vertical semiconductor device described above, the voltage is shared by a depletion layer spreading from the interface of the diffusion layer, so that the electric field does not concentrate therein. In the diffusion layer, the impurity surface density of the end part close to the cell region is higher than the impurity surface density satisfying the RESURF condition, and the impurity surface density of the end part far from the cell region is lower than the impurity surface density satisfying the RESURF condition. In other words, the impurity surface density of the diffusion layer gradually decreases from the end part close to the cell region to the end part far from the cell region, and between these end parts is a section with the impurity surface density satisfying the RESURF condition. As long as the diffusion layer has such an impurity surface density distribution, no significant changes occur in the depletion layer, even when adhesion of external electric charges disturbs the carrier distribution of the diffusion layer. The vertical semiconductor device described above is capable of preventing the drop of the withstand voltage caused by the adhesion of external electric charges. In this vertical semiconductor device, no significant changes occur in the depletion layer, even when fluctuations that are caused in the impurity concentrations of the diffusion layer and a semiconductor layer therebelow during the production of the vertical semiconductor device disturb the carrier distributions of the diffusion layer and the semiconductor layer therebelow. The withstand voltage of this vertical semiconductor device rarely fluctuates against the fluctuations in the impurity concentrations that are caused during the production of the vertical semiconductor device.

In the vertical semiconductor device described above, the region with the impurity surface density lower than that satisfying the RESURF condition is a mild-gradient region having a small mean gradient of the impurity surface density, and the region with the impurity surface density higher than that satisfying the RESURF condition is a steep-gradient region that has a large mean gradient of the impurity surface density. The steep-gradient region has a number of excess carriers that are not involved in the formation of the depletion layer. Therefore, even when the number of carriers in the diffusion layer declines as a result of the adhesion of external electric charges to the surface of the diffusion layer, the excess carriers existing in the steep-gradient region can compensate for the lost carriers of the diffusion layer. As a result, the drop of the withstand voltage caused by the adhesion of external electric charges can be prevented.

Another vertical semiconductor device disclosed in the present specification has a cell region and a non-cell region disposed outside the cell region. This vertical semiconductor device has a diffusion layer disposed in at least part of the non-cell region. In the diffusion layer, a depth directional distribution of a carrier concentration of an end part far from the cell region has its maximum value at a position below a surface of the diffusion layer. The position where the carrier concentration is the maximum is preferably located 0.5 [μm] or more below the surface of the diffusion layer.

When a voltage is applied to the non-cell region of the vertical semiconductor device described above, the voltage is shared by a depletion layer spreading from the interface of the diffusion layer, so that the electric field does not concentrate therein. The way the depletion layer spreads changes according to the carrier concentration of the end part of the diffusion layer that is far from the cell region. The withstand voltage of the vertical semiconductor device depends on the maximum value of the carrier concentration of the end part of the diffusion layer that is far from the cell region. In the vertical semiconductor device described above, the maximum value of the carrier concentration of the end part of the diffusion layer far from the cell region exists in a position below the surface of the diffusion layer and rarely changes even when external electric charges adhere to the surface. The vertical semiconductor device described above can prevent the drop of the withstand voltage caused by the adhesion of external electric charges.

Yet another vertical semiconductor device disclosed in the present specification has a cell region and a non-cell region disposed outside the cell region. This vertical semiconductor device has a diffusion layer disposed in at least part of the non-cell region. A polysilicon layer is laminated on an end part of the diffusion layer that is far from the cell region. The polysilicon layer has a concentration of impurity of the same conductivity type as the diffusion layer, lower than a maximum value of an impurity concentration of the diffusion layer below the polysilicon layer.

When a voltage is applied to the non-cell region of the vertical semiconductor device described above, the voltage is shared by a depletion layer spreading from the interface of the diffusion layer, so that the electric field does not concentrate therein. The way the depletion layer spreads changes according to the carrier concentration of the end part of the diffusion layer that is far from the cell region. The withstand voltage of the vertical semiconductor device depends on the maximum value of the carrier concentration of the end part of the diffusion layer that is far from the cell region. In the vertical semiconductor device described above, a polysilicon layer is laminated on the end part of the diffusion layer that is far from the cell region. The position in the end part of the diffusion layer in which the carrier concentration is the maximum is located far from the surface of the polysilicon layer by the film thickness of the polysilicon layer, the end part being far from the cell region. The maximum value of the carrier concentration of the end part of the diffusion layer rarely changes even when external electric charges adhere to the surface of the polysilicon layer. The vertical semiconductor device described above can prevent the drop of the withstand voltage caused by the adhesion of external electric charges.

In the vertical semiconductor device described above, the polysilicon layer traps carrier that flows from a rear surface of the vertical semiconductor device through the non-cell region to a position in the vicinity of the end part of the diffusion layer that is far from the cell region. This can prevent the carrier from concentrating in the vicinity of the end part of the diffusion layer that is far from the cell region, improving the breakdown strength of the vertical semiconductor device.

DESCRIPTION OF EMBODIMENTS

Embodiments of the present invention are described hereinafter with reference to the drawings. The following embodiments illustrate examples where silicon is used as a semiconductor material; instead, however, silicon carbide, gallium arsenide, gallium nitride, diamond or the like may be used as the semiconductor material.

Embodiment 1

Figure 1:
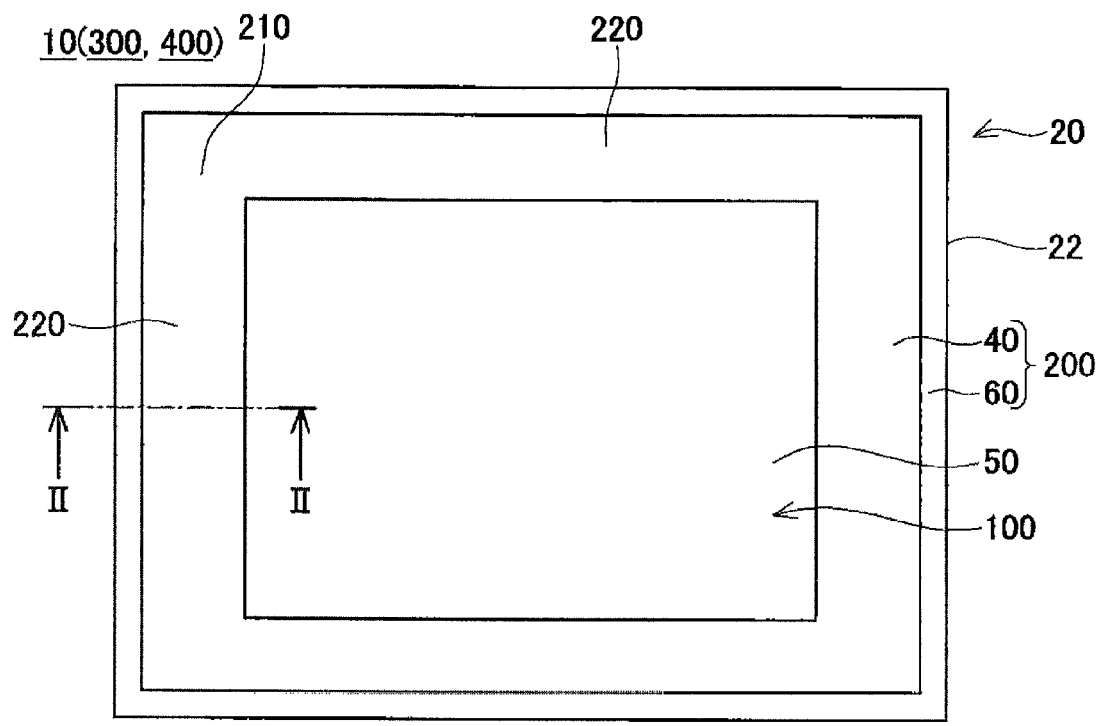
FIG. 1 is a plan view of semiconductor devices 10, 300, and 400 of Embodiments 1, 2, and 3.

As shown in FIG. 1, a semiconductor device 10 according to the present embodiment is a vertical semiconductor device that has a semiconductor element region 100 (corresponding to the cell region) in which a semiconductor element is formed, and a peripheral voltage-withstanding region 200 (corresponding to the non-cell region) surrounding the semiconductor element region 100. In the present embodiment, an IGBT is formed inside the semiconductor element region 100. In other examples, other power semiconductor elements such as MOSFET and diodes may be formed inside the semiconductor element region 100. The semiconductor element region 100 is formed in substantially the middle a semiconductor layer 20. The peripheral voltage-withstanding region 200 is formed along an outer peripheral end 22 of the semiconductor layer 20. The peripheral voltage-withstanding region 200 is a region for ensuring a withstand voltage generated between the outer peripheral end 22 of the semiconductor layer 20 and the semiconductor element region 100.

Figure 2:
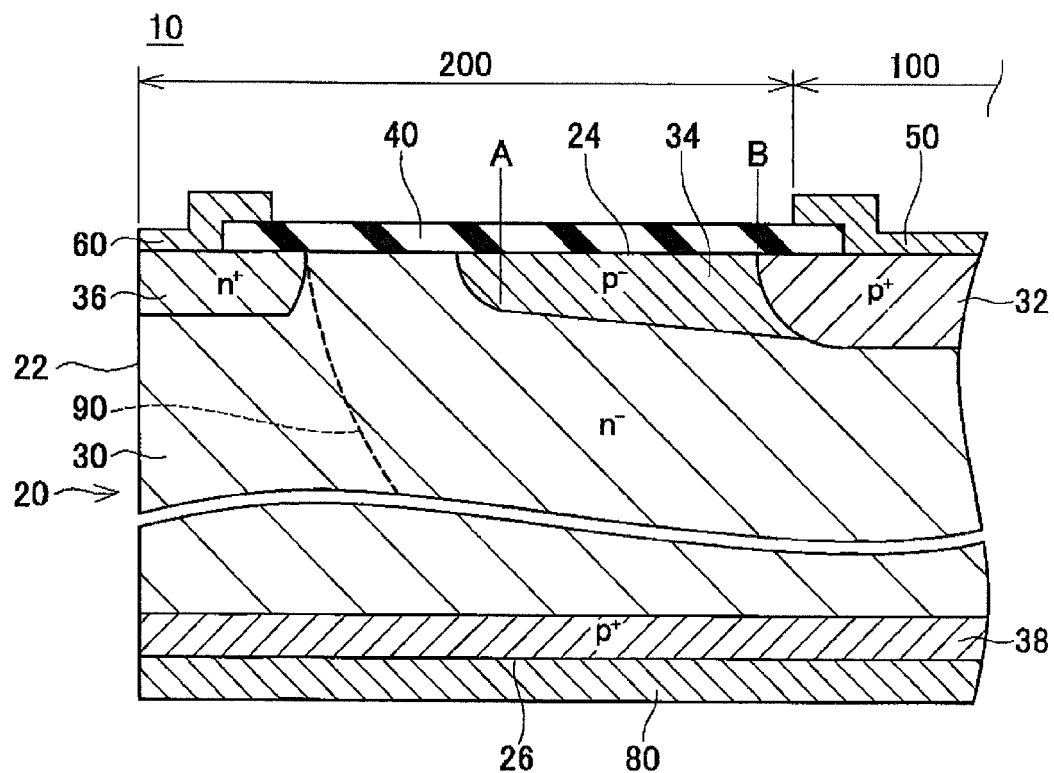
FIG. 2 is a cross-sectional view of a position in the semiconductor device 10 in accordance with Embodiment 1, viewed along arrows II-II in FIG. 1.

As shown in FIG. 2, the semiconductor device 10 is configured mainly by the semiconductor layer 20, an insulating layer 40, a central electrode 50, an outer peripheral electrode 60, and a rear surface electrode 80. The semiconductor layer 20 is made of silicon.

As shown in FIGS. 1 and 2, the central electrode 50 is formed on an upper surface 24 of the semiconductor layer 20 in the semiconductor element region 100. The central electrode 50 is an emitter electrode of the IGBT. The outer peripheral electrode 60 is formed on the upper surface 24 of the semiconductor layer 20 and extends along the outer peripheral end 22 of the semiconductor layer 20. The outer peripheral electrode 60 is a channel stopper electrode. The insulating layer 40 is formed between the central electrode 50 and the outer peripheral electrode 60 on the upper surface 24 of the semiconductor layer 20. The rear surface electrode 80 is formed on a lower surface 26 of the semiconductor layer 20. The rear surface electrode 80 is a collector electrode of the IGBT.

A low-concentration n-type region 30, central electrode contact region 32, RESURF region 34, outer peripheral electrode contact region 36, and rear surface electrode contact region 38 are formed inside the semiconductor layer 20. The rear surface electrode contact region 38 is configured by a p-type semiconductor having a high p-type impurity concentration. The rear surface electrode contact region 38 is formed over the entire surface layer region near the lower surface 26 of the semiconductor layer 20 (a region in the vicinity of the lower surface 26 including the lower surface 26). The rear surface electrode contact region 38 is in ohmic contact with the rear surface electrode 80. The rear surface electrode contact region 38 is a collector region of the IGBT formed inside the semiconductor element region 100. The central electrode contact region 32 is configured by a p-type semiconductor having a high p-type impurity concentration. The central electrode contact region 32 is formed in a surface layer region near the upper surface 24 of the semiconductor layer 20 (a region in the vicinity of the upper surface 24 including the upper surface 24), inside the semiconductor element region 100. The central electrode contact region 32 is in ohmic contact with the central electrode 50. The central electrode contact region 32 is a body region of the IGBT formed inside the semiconductor element region 100. A separation region for separating the central electrode contact region 32 and the RESURF region 34 from each other may be formed therebetween. The low-concentration n-type region 30 is configured by an n-type semiconductor having a low n-type impurity concentration. The low-concentration n-type region 30 is mainly formed in a middle part in a depth direction of the semiconductor layer 20. In the semiconductor element region 100, the low-concentration n-type region 30 is formed between the rear surface electrode contact region 38 and the central electrode contact region 32. The low-concentration n-type region 30 of the semiconductor element region 100 functions as a drift region of the IGBT. Although not shown, in addition to the central electrode contact region 32, low-concentration n-type region 30, and rear surface electrode contact region 38, various n-type or p-type regions (e.g., an emitter region etc.) are formed inside the semiconductor layer 20 within the semiconductor element region 100. Moreover, although not shown, a gate electrode is formed inside the semiconductor element region 100. The IGBT formed inside the semiconductor element region 100 is configured by the central electrode 50, the rear surface electrode 80, the gate electrode, and the various n-type or p-type semiconductor regions of the semiconductor element region 100.

The outer peripheral electrode contact region 36 is configured by an n-type semiconductor having a high n-type impurity concentration. The outer peripheral electrode contact region 36 is formed in a surface layer region near the upper surface 24 of the semiconductor layer 20, the surface layer region being located on the outermost periphery side of the peripheral voltage-withstanding region 200. In other words, the outer peripheral electrode contact region 36 is exposed to the outer peripheral end 22 of the semiconductor layer 20. The outer peripheral electrode contact region 36 is in ohmic contact with the outer peripheral electrode 60. The outer peripheral electrode contact region 36 is a channel stopper region.

The RESURF region 34 (same as the diffusion layer) is configured by a p-type semiconductor having a low p-type impurity concentration. The RESURF region 34 is formed in a surface layer region near the upper surface 24 of the semiconductor layer 20, inside the peripheral voltage-withstanding region 200. One end part of the RESURF region 34 is in contact with the central electrode contact region 32. The abovementioned low-concentration n-type region 30 exists between the outer peripheral electrode contact region 36 and the RESURF region 34. The low-concentration n-type region 30 separates the outer peripheral electrode contact region 36 from the RESURF region 34.

Functions of the peripheral voltage-withstanding region 200 of the semiconductor device 10 are described next. When the IGBT formed inside the semiconductor element region 100 is ON, there is no high potential difference among the electrodes of the semiconductor device 10. When the IGBT is turned off, the potentials of the outer peripheral electrode 60 and rear surface electrode 80 rise as against the potential of the central electrode 50. Consequently, a depletion layer stretches from the central electrode contact region 32 into the low-concentration n-type region 30. In the peripheral voltage-withstanding region 200, the depletion layer extends from the central electrode contact region 32 toward the outer periphery side in the surface layer region near the upper surface 24 of the semiconductor layer 20. At this moment, the RESURF region 34 helps the depletion layer extend toward the outer periphery side. This can prevent the electric field from concentrating in the vicinity of the central electrode contact region 32. The depletion layer of the peripheral voltage-withstanding region 200 reaches the outer peripheral electrode contact region 36. Due to the high n-type impurity concentration of the outer peripheral electrode contact region 36, the depletion layer does not extend to the inside of the outer peripheral electrode contact region 36. In other words, the depletion layer stops at a border between the outer peripheral electrode contact region 36 and the low-concentration n-type region 30, as shown by a dotted line 90 in FIG. 2. Therefore, the depletion layer does not extend to the outer periphery beyond the outer peripheral electrode contact region 36. Accordingly, the depletion layer is prevented from extending to the outer peripheral end 22 of the semiconductor layer 20. As described above, when the IGBT is OFF, the depletion layer is formed in the region between the central electrode contact region 32 and the outer peripheral electrode contact region 36 (e.g., in the low-concentration n-type region 30 and the RESURF region 34). A large portion of the voltage between the central electrode 50 and the outer peripheral electrode 60 is shared by this depleted region.

Figure 3:
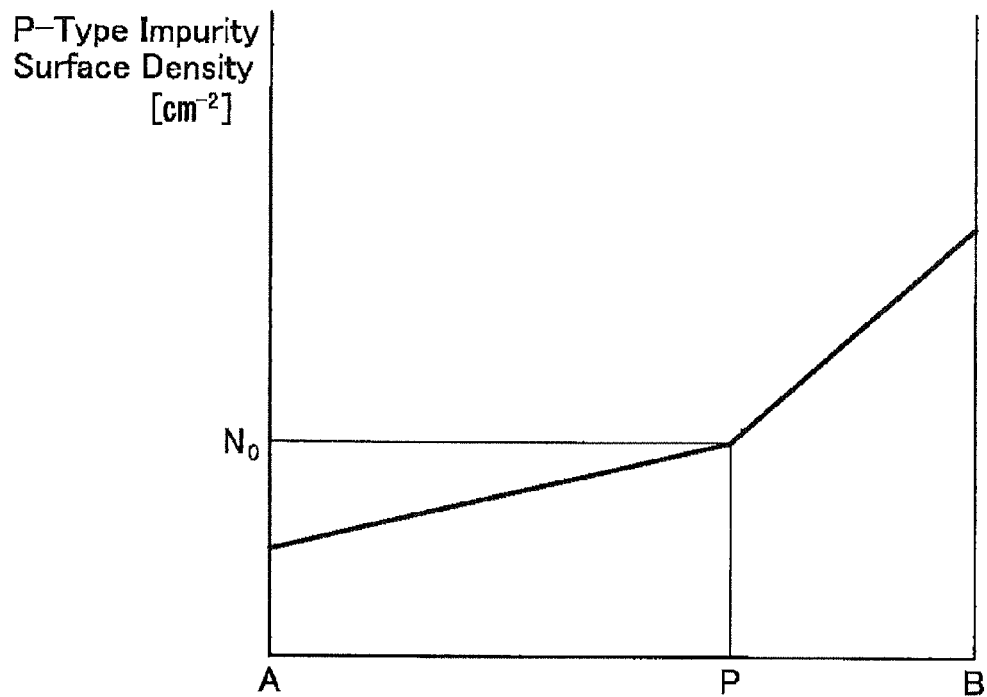
FIG. 3 shows a distribution of a p-type impurity surface density of a RESURF region 34 of the semiconductor device 10 in accordance with Embodiment 1.

FIG. 3 shows a surface density distribution of a p-type impurity of the RESURF region 34. The p-type impurity surface density of the RESURF region 34 has a distribution in which the surface density gradually decreases from an end part B near the center of the semiconductor layer 20 (near the semiconductor element region 100) to an end part A on the outer periphery side (far from the semiconductor element region 100). The p-type impurity surface density of the RESURF region 34 has a reference surface density at a position closer to the center-side end part B than the intermediate position between the center-side end part B and the outer periphery-side end part A. The reference surface density is a surface density that satisfies a so-called RESURF condition. In the present embodiment, the reference surface density is expressed as follows: $N_0=1\times10^{12}$ [cm$^{-2}$]. The position where the p-type impurity surface density becomes the reference surface density is represented as a reference position P. In the present embodiment, a mean gradient of the p-type impurity surface density of a position closer to the center than the reference position P is steeper than a mean gradient of the p-type impurity surface density of a position closer to the outer periphery than the reference position P. More specifically, the mean gradient of the p-type impurity surface density of the position closer to the center than the reference position P is set to be 1.3 times greater than the mean gradient of the p-type impurity surface density of the position closer to the outer periphery than the reference position P. In the following description, the region with a steep mean gradient of the p-type impurity surface density is referred to as "steep-gradient region," and the region with a mild mean gradient of the p-type impurity surface density is referred to as "mild-gradient region." In the present embodiment, the maximum p-type impurity surface density of the RESURF region 34 is equal to or lower than $5\times10^{13}$ [cm$^{-2}$].

Figure 4:
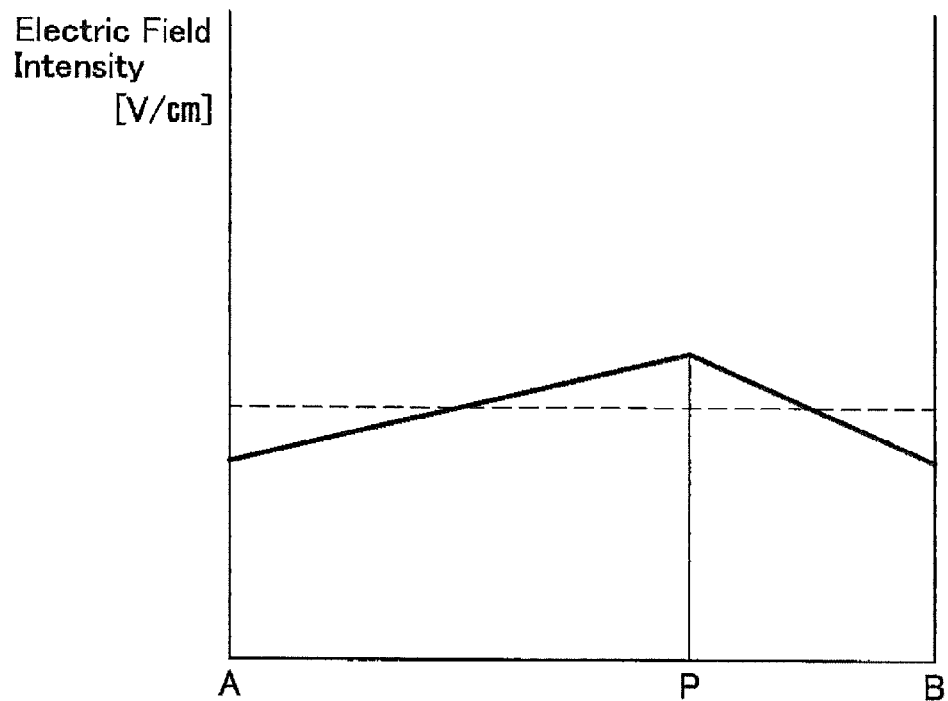
FIG. 4 shows an electric field intensity distribution of a depletion layer of the semiconductor device 10 in accordance with Embodiment 1.

FIG. 4 shows an electric field intensity distribution of the depletion layer, which is obtained when the IGBT is OFF and a voltage is applied between the central electrode 50 and the outer peripheral electrode 60. In FIG. 4, the solid line shows that the p-type impurity surface density of the RESURF region 34 has the distribution shown in FIG. 3, and the dashed line shows that the p-type impurity surface density of the RESURF region 34 is the constant reference surface density $N_0$.

When the p-type impurity surface density of the RESURF region 34 is the constant reference surface density $N_0$, the electric field intensity distribution of the depletion layer is uniform. Therefore, under ideal circumstances where there are no fluctuations in the p-type impurity concentration, the semiconductor device 10 has the highest withstand voltage. However, when the p-type impurity concentration fluctuates, the p-type impurity surface density of the RESURF region 34 completely fails to fulfill the RESURF condition, resulting in substantial fluctuations in the electric field intensity distribution of the depletion layer. This eventually has a large impact on the withstand voltage of the semiconductor device 10.

On the other hand, in the semiconductor device 10 of the present embodiment, the p-type impurity surface density of the RESURF region 34 has the distribution shown in FIG. 3, in which the electric field intensity distribution of the depletion layer has its maximum value in the vicinity of the reference position P. Therefore, under ideal circumstances where there are no fluctuations in the p-type impurity concentration, the withstand voltage of the semiconductor device 10 is low compared to when the p-type impurity surface density is the constant reference surface density $N_0$. In the semiconductor device 10 of the present embodiment, however, even when the p-type impurity concentration fluctuates, the reference position P where the p-type impurity surface density is the reference surface density $N_0$, moves from the center side to the outer periphery side, but the electric field intensity distribution of the depletion layer does not change much, having little impact on the withstand voltage of the semiconductor device 10. The semiconductor device 10 that is robust against the fluctuations of the p-type impurity concentration can be realized.

Next is discussed the impact of external electric charges, such as movable ions, on the withstand voltage of the semiconductor device 10 during the OFF state of the IGBT. The adhesion of external electric charges to the surface of the insulating layer 40 disturbs the carrier distribution in the semiconductor layer 20, having an impact on the formation of the depletion layer. For instance, when positive electric charges adhere to the surface of the insulating layer 40, the positive electric charges attract electrons of the semiconductor layer 20, resulting in a reduction of the number of holes in the RESURF region 34. When, on the other hand, negative electric charges adhere to the surface of the insulating layer 40, the negative electric charges attract the holes of the semiconductor layer 20, resulting in an increase in the number of holes in the RESURF region 34. In either case, the adhesion of the external electric charges affects the formation of the depletion layer, reducing the withstand voltage of the semiconductor device 10.

In the semiconductor device 10 of the present embodiment, the steep-gradient region is formed in the range closer to the center than the reference position P of the RESURF region 34. This steep-gradient region has a number of excess holes that are not involved in the formation of the depletion layer. Movement of the holes of this steep-gradient region can compensate for the lost holes caused as a result of the adhesion of the positive electric charges. Therefore, according to the semiconductor device 10 of the present embodiment, the impact of the adhesion of the positive electric charges as the external electric charges on the withstand voltage of the semiconductor device 10 can be reduced.

Figure 5:
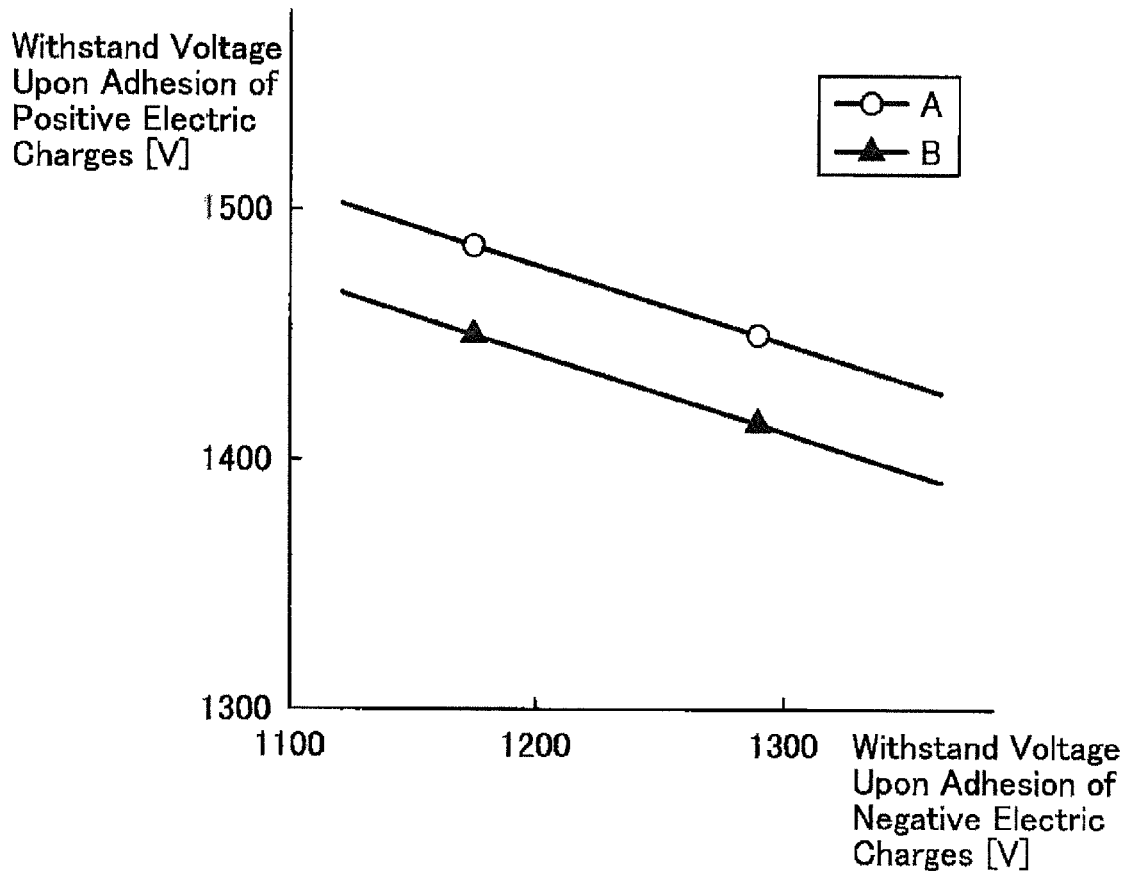
FIG. 5 shows a relationship between the withstand voltage of the semiconductor device 10 upon adhesion of positive electric charges and the withstand voltage of the same upon adhesion of negative electric charges, in accordance with Embodiment 1.

FIG. 5 shows a relationship between the withstand voltage of the semiconductor device 10 upon the adhesion of the positive electric charges and the withstand voltage of the same upon the adhesion of the negative electric charges, in a case (A) where the p-type impurity surface density of the RESURF region 34 has the distribution shown in FIG. 3 and a case (B) where the gradient of p-type impurity surface density of the RESURF region 34 is constant. In general, the withstand voltage obtained upon the adhesion of the positive electric charges and the withstand voltage obtained upon the adhesion of the negative electric charges are in a trade-off relationship. In the case where the gradient of the p-type impurity surface density of the RESURF region 34 is constant, increasing the gradient can improve the withstand voltage obtained upon the adhesion of the positive electric charges but reduces the withstand voltage obtained upon the adhesion of the negative electric charges.

In the case where the p-type impurity surface density of the RESURF region 34 has the distribution shown in FIG. 3, the withstand voltage obtained upon the adhesion of the positive electric charges can be improved without reducing the withstand voltage obtained upon the adhesion of the negative electric charges. The withstand voltages obtained upon the adhesion of the positive electric charges and negative electric charges can be improved to above the trade-off limits when the gradient of the p-type impurity surface density of the RESURF region 34 is constant.

The RESURF region 34 with the above-described p-type impurity surface density distribution can be created in various ways. The RESURF region 34 with the above-described p-type impurity surface density distribution can be formed by, for example, reducing the opening diameter of a resist gradually from the center side to the outer periphery side upon injection of the p-type impurity. Or, the RESURF region 34 with the above-described p-type impurity surface density distribution can be formed by increasing the interval between the openings of the resist gradually from the center side to the outer periphery side. The RESURF region 34 with the above-described p-type impurity surface density can also be formed by reducing the thickness of the resist gradually from the center side to the outer periphery side.

Figure 6:
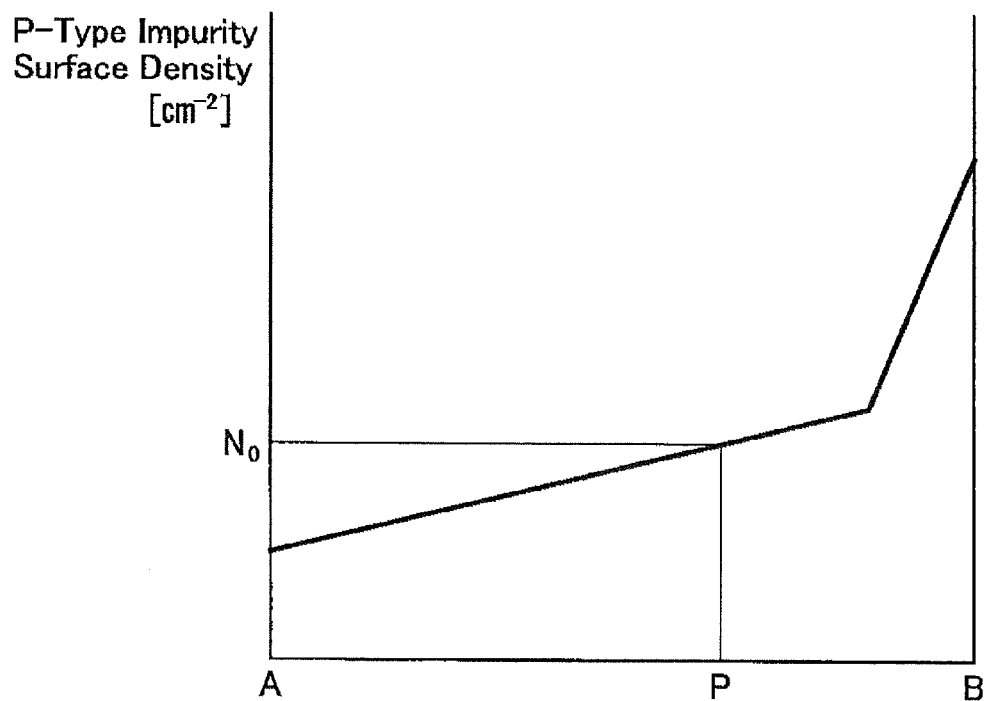
FIG. 6 shows another distribution of the p-type impurity surface density of the RESURF region 34 of the semiconductor device 10 in accordance with Embodiment 1.
Figure 7:
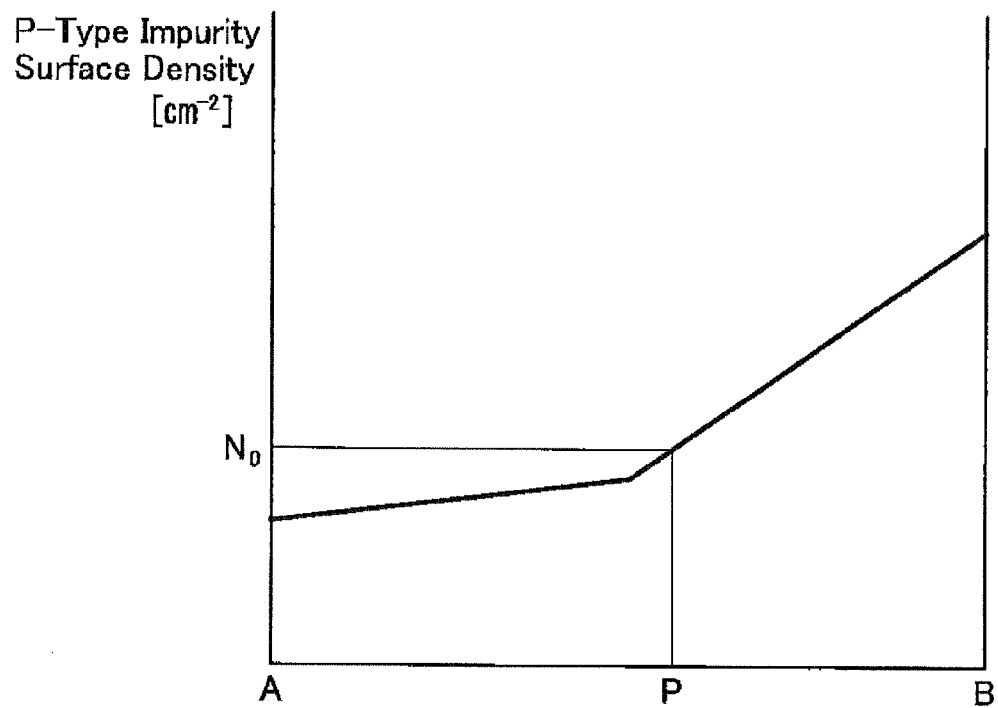
FIG. 7 shows another distribution of the p-type impurity surface density of the RESURF region 34 of the semiconductor device 10 in accordance with Embodiment 1.
Figure 8:
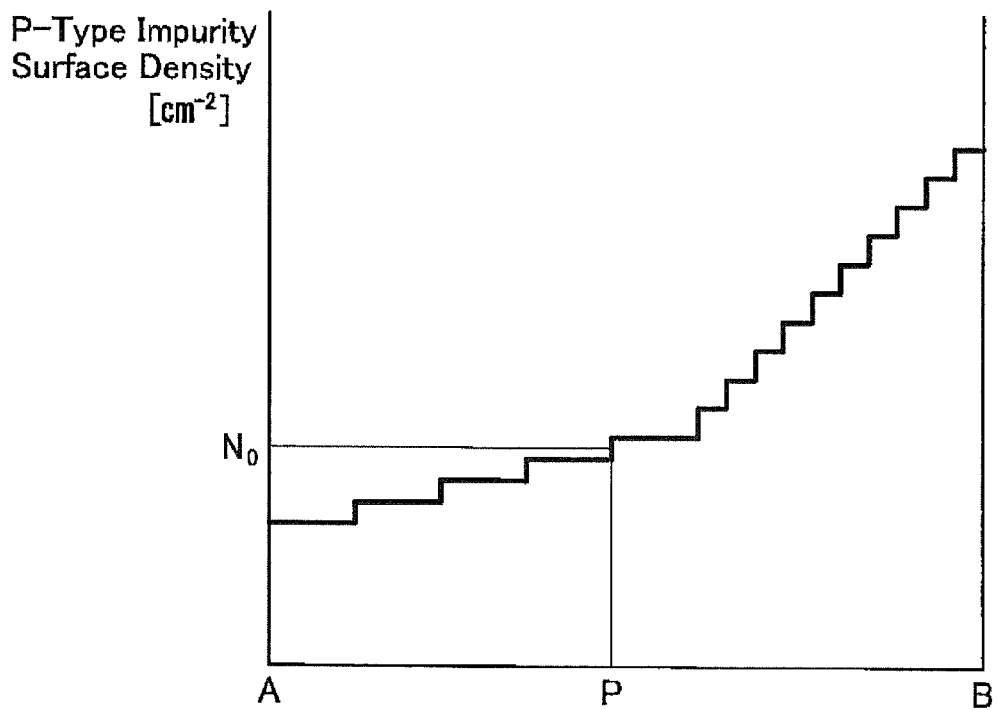
FIG. 8 shows another distribution of the p-type impurity surface density of the RESURF region 34 of the semiconductor device 10 in accordance with Embodiment 1.
Figure 9:
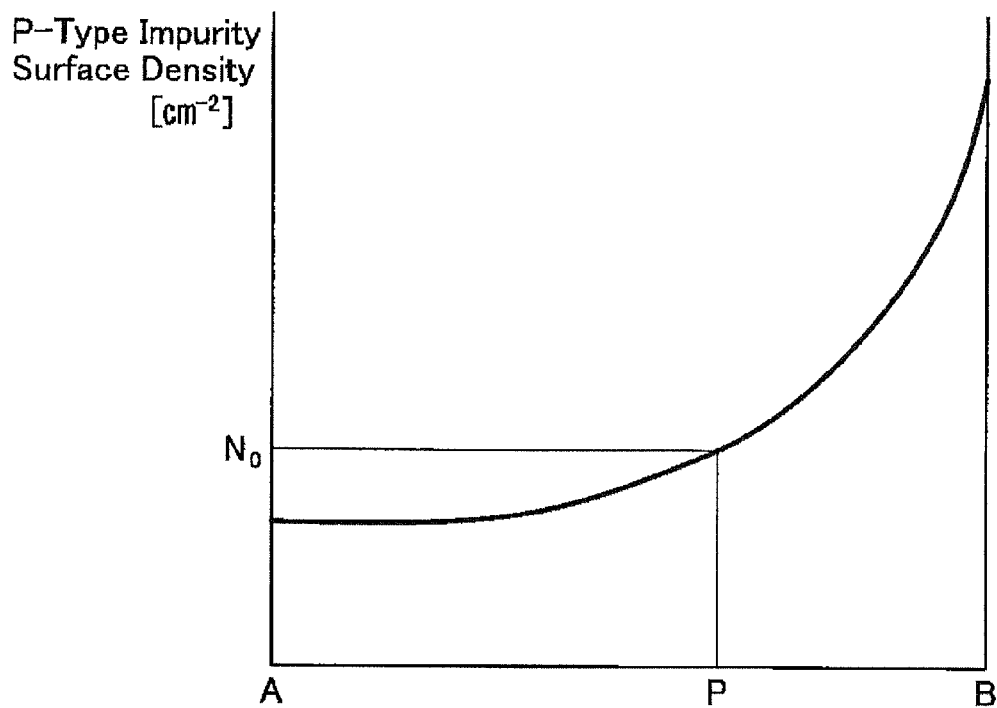
FIG. 9 shows another distribution of the p-type impurity surface density of the RESURF region 34 of the semiconductor device 10 in accordance with Embodiment 1.
Figure 10:
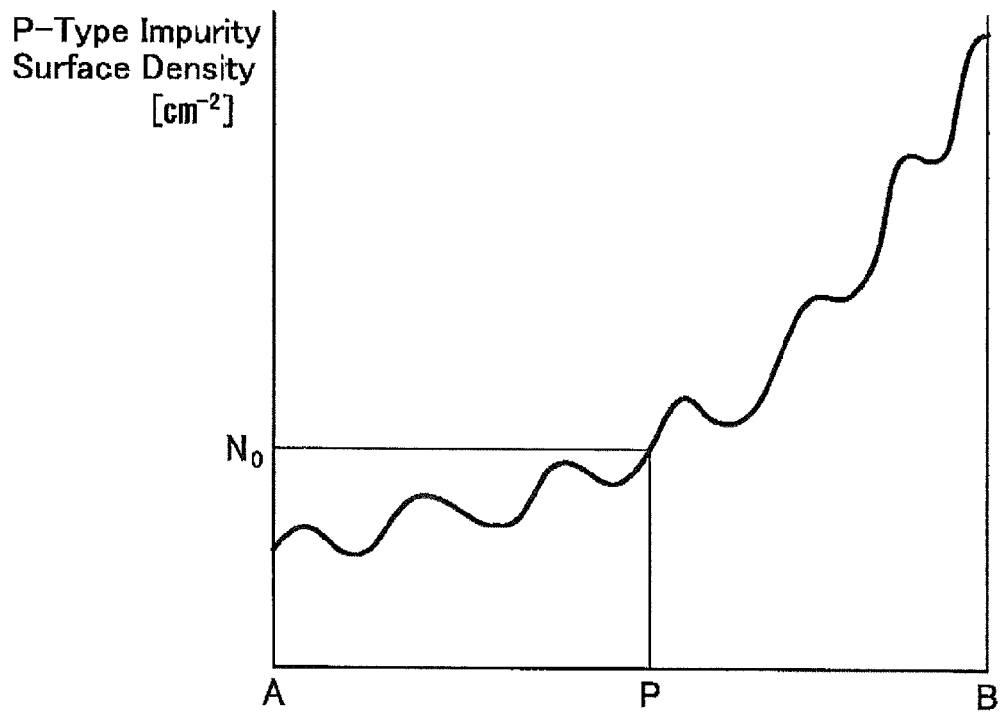
FIG. 10 shows another distribution of the p-type impurity surface density of the RESURF region 34 of the semiconductor device 10 in accordance with Embodiment 1.
Figure 11:
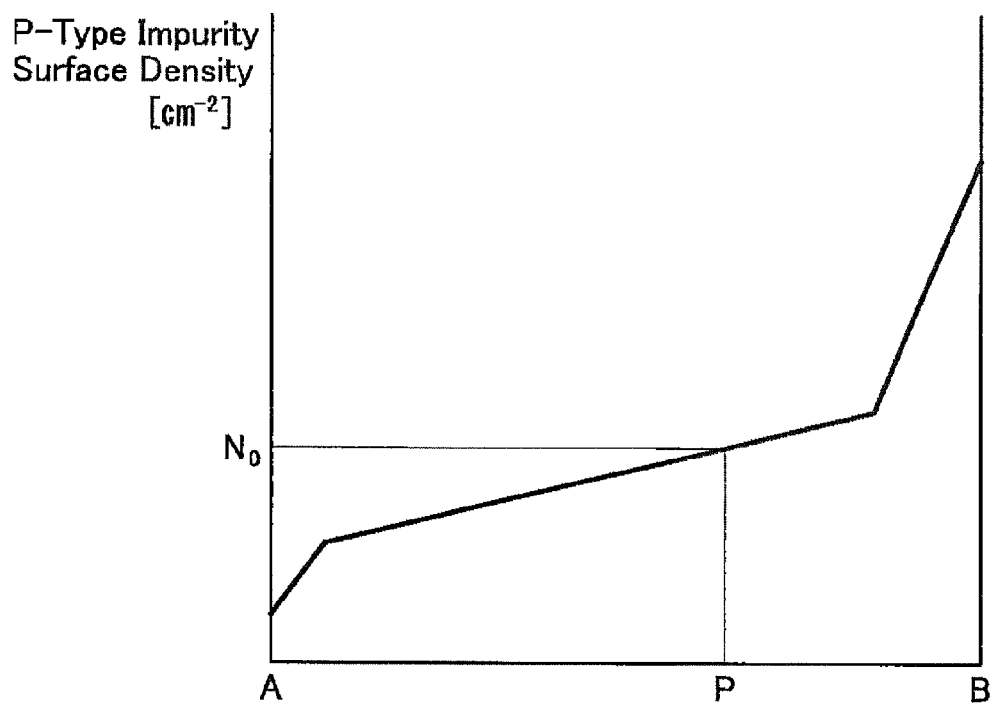
FIG. 11 shows another distribution of the p-type impurity surface density of the RESURF region 34 of the semiconductor device 10 in accordance with Embodiment 1.

The p-type impurity surface density of the RESURF region 34 may have any type of distribution as long as the mean gradient within the range above the reference surface density $N_a$ is steeper than the mean gradient within the range lower than the reference surface density $N_0$. For example, as shown in FIG. 6, the p-type impurity surface density above the reference surface density $N_0$ may change between the steep gradient and the mild gradient. Or, as shown in FIG. 7, the p-type impurity surface density below the reference surface density $N_0$ may change between the steep gradient and the mild gradient. Furthermore, the p-type impurity surface density may decrease in a stepwise fashion as shown in FIG. 8 or in a curved fashion as shown in FIG. 9. Moreover, as shown in FIG. 10, the p-type impurity surface density may show its overall decrease while repeating increase and decrease locally. In addition, as shown in FIG. 11, the p-type impurity surface density may change from the steep gradient to the mild gradient and then to the steep gradient, from the center-side end part B to the outer periphery-side end part A. In any case, it is preferred that the mean gradient within the range above the standard surface density $N_0$ be steeper than the mean gradient within the range lower than the standard surface density $N_0$.

In the peripheral voltage-withstanding region 200 shown in FIG. 1, the electric field is apt to concentrate more in a corner part 210 than a straight line part 220, and the withstand voltage of the semiconductor device 10 is usually determined according to the electric field intensity distribution of the corner part 210. For this reason, the p-type impurity surface density of the RESURF region 34 at the corner part 210 may have the distribution shown in FIG. 3, and the p-type impurity surface density of the RESURF region 34 at the straight line part 220 may be constant. Alternatively, the p-type impurity surface density of the RESURF region 34 at the corner part 210 may have the distribution shown in FIG. 3, and the p-type impurity surface density of the RESURF region 34 at the straight line part 220 may have a constant gradient.

Embodiment 2

Figure 12:
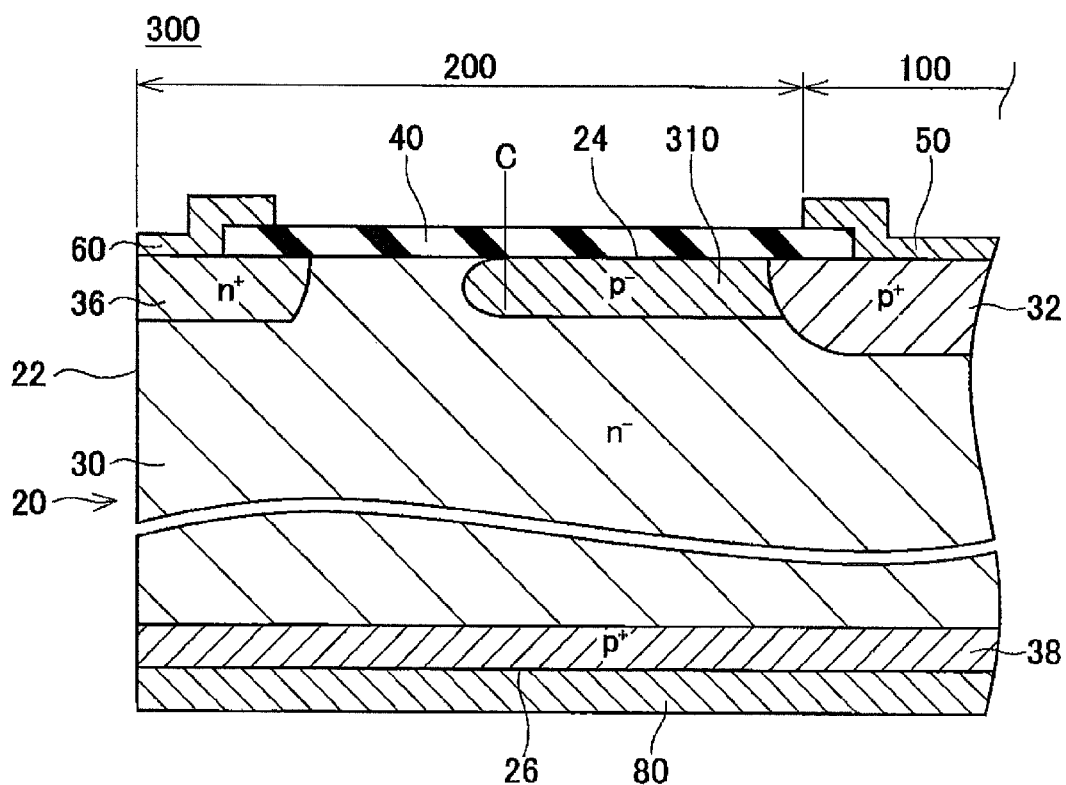
FIG. 12 is a cross-sectional view of a position in the semiconductor device 300 in accordance with Embodiment 2, viewed along arrows II-II in FIG. 1.

A semiconductor device 300 according to the present embodiment has substantially the same configurations as the semiconductor device 10 of Embodiment 1. In the following description, same reference numerals are used for indicating the same configurations as those of the semiconductor device 10 of Embodiment 1, and therefore the overlapping detailed explanations are omitted accordingly. As shown in FIG. 12, the semiconductor device 300 of the present embodiment has a RESURF region 310 in place of the RESURF region 34 of Embodiment 1.

The RESURF region 310 is configured by a p-type semiconductor having a low p-type impurity concentration. The RESURF region 310 is formed in a surface layer region near the upper surface 24 of the semiconductor layer 20, inside the peripheral voltage-withstanding region 200. One end part of the RESURF region 310 is in contact with the central electrode contact region 32. The low-concentration n-type region 30 exists between the outer peripheral electrode contact region 36 and the RESURF region 310. The low-concentration n-type region 30 separates the outer peripheral electrode contact region 36 from the RESURF region 310.

Figure 13:
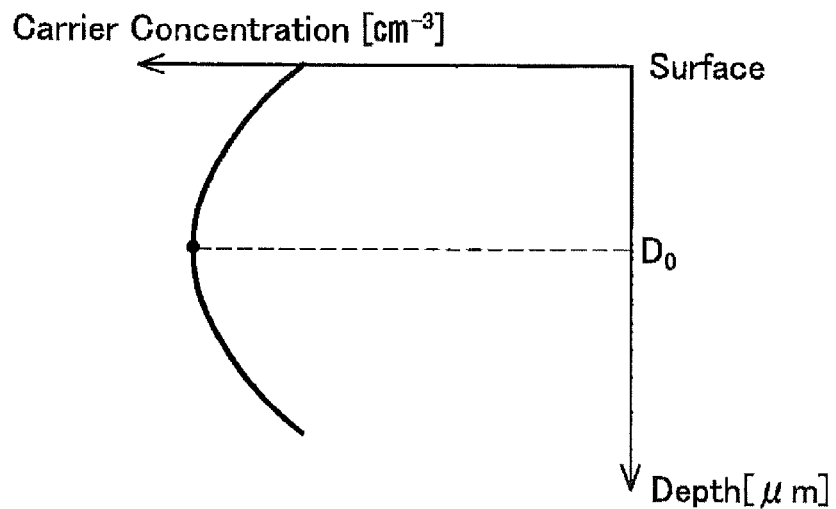
FIG. 13 shows a depth directional distribution of a hole concentration in an outer periphery-side end part C of a RESURF region 310 of the semiconductor device 300 in accordance with Embodiment 2.

The RESURF region 310 has a hole concentration distribution shown in FIG. 13, at an outer periphery-side end part C, in a depth direction from the surface. The hole concentration at the outer periphery-side end part C increases in the depth direction from the surface, reaches its maximum value at depth $D_0$, and then decreases in the depth direction. In the present embodiment, the depth $D_0$ where the hole concentration is the maximum is 0.5 [μm] below the surface. The depth $D_0$ where the hole concentration is the maximum is preferably 0.5 [μm] or more below the surface.

According to the semiconductor device 300 of the present embodiment, the RESURF region 310 can be formed in the manner described above, and the impact of adhesion of the external electric charges on the withstand voltage of the semiconductor device 300 can be reduced. As described in Embodiment 1, the adhesion of the external electric charges to the surface of the insulating layer 40 disturbs the carrier distribution in the RESURF region 310, having an impact on the formation of the depletion layer and reducing the withstand voltage of the semiconductor device 300. The withstand voltage of the semiconductor device 300 depends on the maximum value of the hole concentration at the outer periphery-side end part C of the RESURF region 310. A decrease of the maximum value of the hole concentration at the outer periphery-side end part C of the RESURF region 310 as a result of the adhesion of the external electric charges reduces the withstand voltage of the semiconductor device 300.

In the semiconductor device 300 of the present embodiment, because the hole concentration reaches its maximum value at the depth $D_0$ in the outer periphery-side end part C of the RESURF region 310, the adhesion of the external electric charges causes almost no changes in the maximum value of the hole concentration. According to this configuration, the drop of the withstand voltage of the semiconductor device 300 caused by the adhesion of the external electric charges can be prevented.

Even when the p-type impurity is injected in a manner that the p-type impurity concentration of the RESURF region 310 becomes the maximum at the uppermost surface, p-type impurity segregation that is caused in the interface of the silicon/oxide film by the application of heat eventually brings the peak of the p-type impurity concentration (i.e., the peak of the hole concentration) to the level of approximately 0.4 [μm] below the surface. However, the semiconductor device 300 of the present embodiment is characterized in that the peak is positioned far deeper than the peak that is moved due to the segregation.

For example, when boron is injected as the p-type impurity, the RESURF region 310 of the semiconductor device 300 of the present embodiment can be formed by implanting $1 \times 10^{12}$ [$cm^{-2}$] to $5 \times 10^{13}$ [$cm^{-2}$] of ions in the outer periphery-side end part C at an acceleration energy of 1 [MeV] to 5 [MeV].

When forming the RESURF region 310 in this manner, the surface concentration ratio in the outer periphery-side end part C of the RESURF region 310 (the ratio of the carrier concentration of the surface to the maximum value of the carrier concentration) is equal to or lower than 0.75.

The hole concentration at the outer periphery-side end part C of the RESURF region 310 may have the depth directional distribution shown in FIG. 13. For example, the position where the hole concentration becomes the maximum may be at a constant depth over the range from the center side of the RESURF region 310 to the outer periphery side. Or, the position where the hole concentration becomes the maximum may fall deeper and deeper from the center side of the RESURF region 310 to the outer periphery side. The position where the hole concentration becomes the maximum may increase and decrease irregularly in the range from the center side of the RESURF region 310 to the outer periphery side. Alternatively, the RESURF region 310 itself may be formed at a deep part far from the surface of the semiconductor layer 20. It is sufficient that the RESURF region 310 be formed in a manner that the depth directional distribution of the hole concentration becomes the maximum at a position below the surface, in the outer periphery-side end part C of the RESURF region 310.

Figure 14:
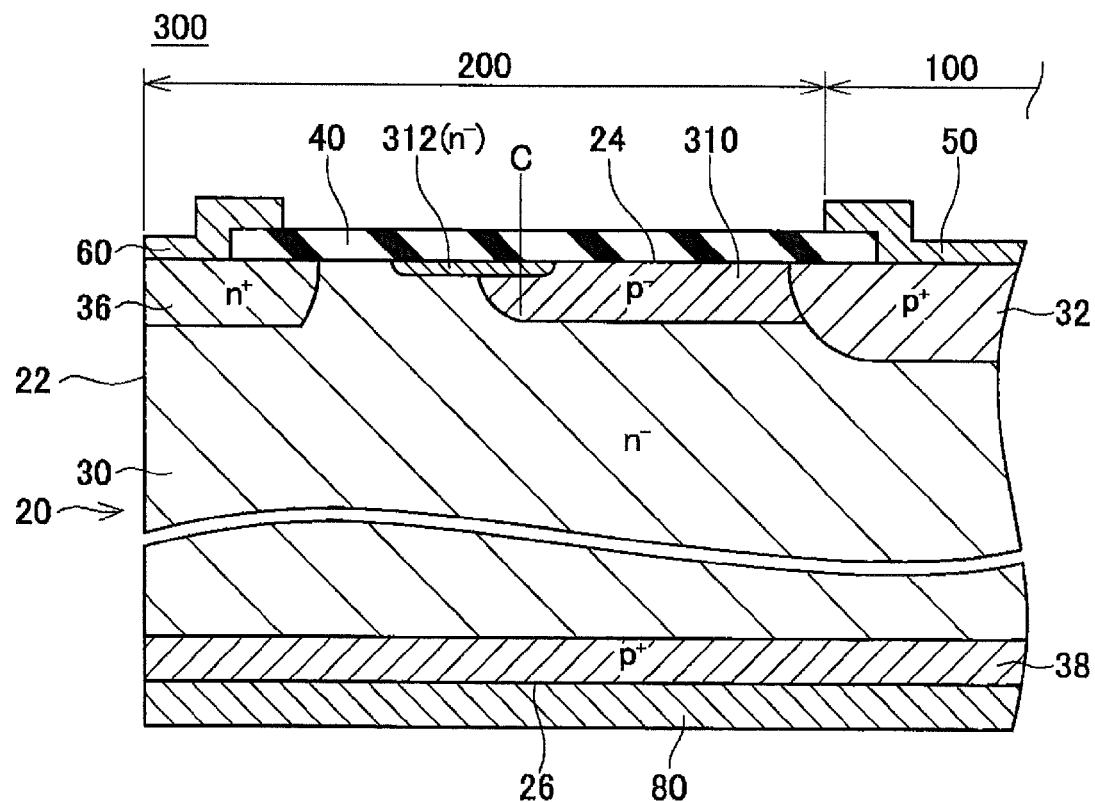
FIG. 14 is a cross-sectional view of a position in the semiconductor device 300 in accordance with Embodiment 2, viewed along arrows II-II in FIG. 1.

As shown in FIG. 14, after forming the RESURF region 310 in a manner that the p-type impurity concentration of its outer periphery-side end part C becomes the maximum at the uppermost surface, a low-concentration n-type region 312 may be formed above the outer periphery-side end part C of the RESURF region 310. In this case as well, the depth directional distribution of the hole concentration in the outer periphery-side end part C of the RESURF region 310 can have the maximum value at a position below the surface. When forming the RESURF region 310 and the low-concentration n-type region 312 in the manner described above, the withstand voltage of the semiconductor device 300 might drop if the n-type impurity concentration of the low-concentration n-type region 312 is higher than the p-type impurity concentration of the RESURF region 310. The n-type impurity concentration of the low-concentration n-type region 312 needs to be lower than the p-type impurity concentration of the RESURF region 310.

Embodiment 3

Figure 15:
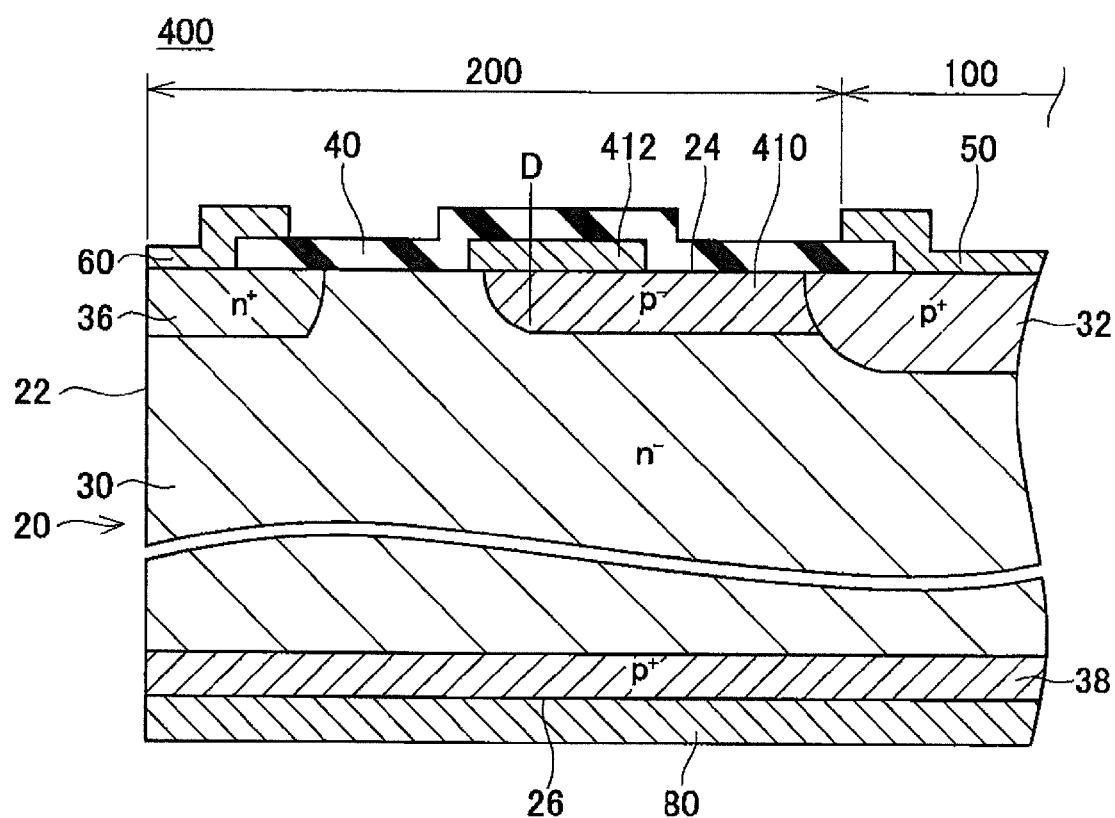
FIG. 15 is a cross-sectional view of a position in the semiconductor device 400 in accordance with Embodiment 3, viewed along arrows II-II in FIG. 1.

A semiconductor device 400 according to the present embodiment has substantially the same configurations as the semiconductor device 10 of Embodiment 1. In the following description, same reference numerals are used for indicating the same configurations as those of the semiconductor device 10 of Embodiment 1, and therefore the overlapping detailed explanations are omitted accordingly. As shown in FIG. 15, the semiconductor device 400 of the present embodiment has a RESURF region 410 in place of the RESURF region 34 of Embodiment 1.

The RESURF region 410 is configured by a p-type semiconductor having a low p-type impurity concentration. The RESURF region 410 is formed in a surface layer region near the upper surface 24 of the semiconductor layer 20, inside the peripheral voltage-withstanding region 200. One end part of the RESURF region 410 is in contact with the central electrode contact region 32. The low-concentration n-type region 30 exists between the outer peripheral electrode contact region 36 and the RESURF region 410. The low-concentration n-type region 30 separates the outer peripheral electrode contact region 36 from the RESURF region 410.

A polysilicon layer 412 is laminated on an outer periphery-side end part D of the RESURF region 410. The polysilicon layer 412 is doped with a p-type impurity of the same element as the p-type impurity of the RESURF region 410. The concentration of the p-type impurity of the polysilicon layer 412 is set to be lower than the p-type impurity concentration of the RESURF region 410 disposed therebelow.

The semiconductor device 400 of the present embodiment has the polysilicon layer 412 disposed therein as described above, to reduce the impact of the adhesion of the external electric charges to the surface of the insulating layer 40, on the withstand voltage of the semiconductor device 400, as in the semiconductor device 300 of Embodiment 2. Because the polysilicon layer 412 is laminated on the outer periphery-side end part D of the RESURF region 410, the position where the hole concentration of the RESURF region 410 reaches its maximum can be as deep as the thickness of the polysilicon layer 412. Consequently, the maximum value of the hole concentration in the outer periphery-side end part D of the RESURF region 410 rarely changes even when the external electric charges adhere to the surface of the insulating layer 40. This configuration can prevent the drop of the withstand voltage of the semiconductor device 400 caused by the adhesion of the external electric charges.

Unlike the semiconductor device 300 of Embodiment 2, the semiconductor device 400 of the present embodiment does not require high energy injection of impurities for forming the RESURF region 410 and the polysilicon layer 412. This can mitigate damage to the silicon upon impurity injection.

Moreover, in the semiconductor device 400 of the present embodiment, the polysilicon layer 412 traps the carrier that flows from the rear surface electrode contact region 38 through the low-concentration n-type region 30 to a position in the vicinity of the outer periphery-side end part D of the RESURF region 410. This can prevent the carrier from concentrating in the vicinity of the outer periphery-side end part D of the RESURF region 410, improving the breakdown strength of the semiconductor device 400.

The polysilicon layer 412 may have any type of configuration as long as its p-type impurity concentration is lower than the p-type impurity concentration of the RESURF region 410 therebelow. For instance, the polysilicon layer 412 may be doped with the p-type impurity of the same element as the p-type impurity contained in the RESURF region 410 to make the entire polysilicon layer 412 p-type. Or, the polysilicon layer 412 may be doped with not only the p-type impurity of the same element as the p-type impurity contained in the RESURF region 410 but also a number of n-type impurities, to make the entire polysilicon layer 412 n-type. In this case, by virtue of the counter-doped n-type impurities of the polysilicon layer 412 in addition to the thickness of the polysilicon layer 412, the depth where the hole concentration is the maximum in the RESURF region 410 can be increased.

The polysilicon layer 412 may be laminated at least on the outer periphery-side end part D of the RESURF region 410. For example, the polysilicon layer 412 may be laminated only on the outer periphery-side end part D of the RESURF region 410 as shown in FIG. 15, or may be laminated on the RESURF region 410 to cover the entire RESURF region 410. Or, the polysilicon layer 412 may be laminated on the outer periphery-side end part D of the RESURF region 410 as well as partially on another section of the RESURF region 410. In this case, the p-type impurity concentration of the polysilicon layer 412 may be lower than the p-type impurity concentration of the RESURF region 410, on the outer periphery-side end part D of the RESURF region 410. In other sections, the p-type impurity concentration of the polysilicon layer 412 may be higher than the p-type impurity concentration of the RESURF region 410 therebelow.

The polysilicon layer 412 may be laminated on the upper surface 24 of the semiconductor layer 20 as shown in FIG. 15, or may be created by forming a trench on the upper surface 24 of the semiconductor layer 20 and filling the trench with polysilicon.

The specific embodiments of the present invention are described above in detail. However, these embodiments are merely illustrative and therefore do not limit the scope of claims. The technologies described in the claims are intended to cover all modifications and variations of the specific embodiments illustrated above.

For instance, the characteristics of Embodiment 1 can be combined with the characteristics of Embodiment 2. In other words, the RESURF region 34 of the semiconductor device 10 according to Embodiment 1 shown in FIG. 2 may be created in a manner that the hole concentration distribution shown in FIG. 13 is provided in the outer periphery-side end part A in the depth direction from the surface. Alternatively, the characteristics of Embodiment 1 can be combined with the characteristics of Embodiment 3. In other words, the polysilicon layer 412 shown in FIG. 15 may be laminated on the outer periphery-side end part A of the RESURF region 34 of the semiconductor device 10 according to Embodiment 1 shown in FIG. 2. Alternatively, the all characteristics of Embodiments 1, 2, and 3 can be combined.

The technical elements described in the present specification or drawings exert their technical ability, alone or by various combinations, so that they are not limited to the combinations described in the claims. In addition, the technologies illustrated in the present specification and drawings attain a plurality of objects simultaneously, and attainment of one of the objects has by itself the technical availability.

REFERENCE SIGNS LIST

10 semiconductor device; 20 semiconductor layer; 22 outer peripheral end; 24 upper surface; 26 lower surface; 30 low-concentration n-type region; 32 central electrode contact region; 34 RESURF region; 36 outer peripheral electrode contact region; 38 rear surface electrode contact region; 40 insulating layer; 50 central electrode; 60 outer peripheral electrode; 80 rear surface electrode; 90 dotted line; 100 semiconductor element region; 200 peripheral voltage-withstanding region; 210 corner part; 220 straight line part; 300 semiconductor device; 310 RESURF region; 312 low-concentration n-type region; 400 semiconductor device; 410 RESURF region; 412 polysilicon layer

The invention claimed is:

1. A vertical semiconductor device, comprising:
a cell region;
a non-cell region disposed outside the cell region; and
a diffusion layer disposed in at least part of the non-cell region,
wherein when the vertical semiconductor device is viewed in a plane passing through the diffusion layer and the cell region, the diffusion layer has an impurity surface density higher than $1 \times 10^{12}$ [cm$^{-2}$], which satisfies a RESURF condition, at an end part close to the cell region, and an impurity surface density lower than $1 \times 10^{12}$ [cm$^{-2}$], which satisfies the RESURF condition, at an end part far from the cell region, and
wherein a substantially linear relation between the impurity surface density and a length of the vertical semiconductor device when viewed in the plane in a region in the diffusion layer that has the impurity surface density higher than that satisfying the RESURF condition has a greater mean gradient of the impurity surface density than a substantially linear relation between the impurity surface density and a length of the vertical semiconductor device when viewed in the plane in a region in the diffusion layer that has the impurity surface density lower that that satisfying a RESURF condition.

2. The vertical semiconductor device according to claim 1, wherein, in the diffusion layer, a depth directional distribution of a carrier concentration of an end part far from the cell region has its maximum value at a position below a surface of the diffusion layer.

3. The vertical semiconductor device according to claim 1, wherein a polysilicon layer is laminated on an end part of the diffusion layer that is far from the cell region, and
the polysilicon layer has a concentration of impurity of the same conductivity type as the diffusion layer, that is lower than a maximum value of an impurity concentration of the diffusion layer below the polysilicon layer.

* * * * *

UNITED STATES PATENT AND TRADEMARK OFFICE
CERTIFICATE OF CORRECTION

| | | |
|---|---|---|
| PATENT NO. | : 9,035,415 B2 | Page 1 of 1 |
| APPLICATION NO. | : 13/640447 | |
| DATED | : May 19, 2015 | |
| INVENTOR(S) | : M. Senoo | |

It is certified that error appears in the above-identified patent and that said Letters Patent is hereby corrected as shown below:

In the Specification

At column 9, line 25, change "$N_a$ is steeper" to -- $N_o$ is steeper --.

Signed and Sealed this
Twenty-ninth Day of December, 2015

Michelle K. Lee
*Director of the United States Patent and Trademark Office*